United States Patent [19]

Kitayoshi

[11] Patent Number: 5,093,627

[45] Date of Patent: Mar. 3, 1992

[54] IMPEDANCE AND TRANSFER CHARACTERISTIC MEASURING APPARATUS

[75] Inventor: Hitoshi Kitayoshi, Gyoda, Japan

[73] Assignee: Advantest Corporation, Tokyo, Japan

[21] Appl. No.: 580,539

[22] Filed: Sep. 11, 1990

[30] Foreign Application Priority Data

Sep. 11, 1989 [JP] Japan .................. 1-235317

[51] Int. Cl.$^5$ .................................................. G01R 27/00
[52] U.S. Cl. ........................... 324/709; 324/649; 324/658; 324/683; 324/691; 324/615
[58] Field of Search .............. 324/649, 650, 654, 658, 324/683, 691, 709, 607, 615, 521

[56] References Cited

U.S. PATENT DOCUMENTS

| | | | |
|---|---|---|---|
| 3,479,586 | 11/1969 | Perra | 324/650 |
| 3,935,437 | 1/1976 | Schmitt et al. | 324/77 B X |
| 4,458,196 | 7/1984 | Goyal et al. | 324/649 |
| 4,816,745 | 3/1989 | Schneider | 324/607 X |

Primary Examiner—Kenneth A. Wieder
Assistant Examiner—Glenn W. Brown
Attorney, Agent, or Firm—Staas & Halsey

[57] ABSTRACT

In an impedance and transfer characteristic measuring apparatus sine-wave and cosine-wave data are produced using data obtained by accumulating a fixed phase value in synchronism with a clock signal and the sine-wave data is provided to a device under test after D-A conversion. Multiplied outputs are obtained by multiplying type D-A converting part which D-A converts the sine-wave data and the cosine-wave data, using two signals related to an item of measurement of the device under test as analog multiply inputs therefor. An intergration control signal of a predetermined level is generated by a signal generating part for the half-cycle period of a sine-wave test signal in synchronism with a measurement start signal. For the period during which the intergration control signal is yielded the multiplied outputs are respectively integrated in an integration circuit part to thereby obtain vector-detected outputs. The detected outputs are A-D converted, and based on the digital detected outputs, a calculating part performs calculations related to the item of measurement.

8 Claims, 8 Drawing Sheets

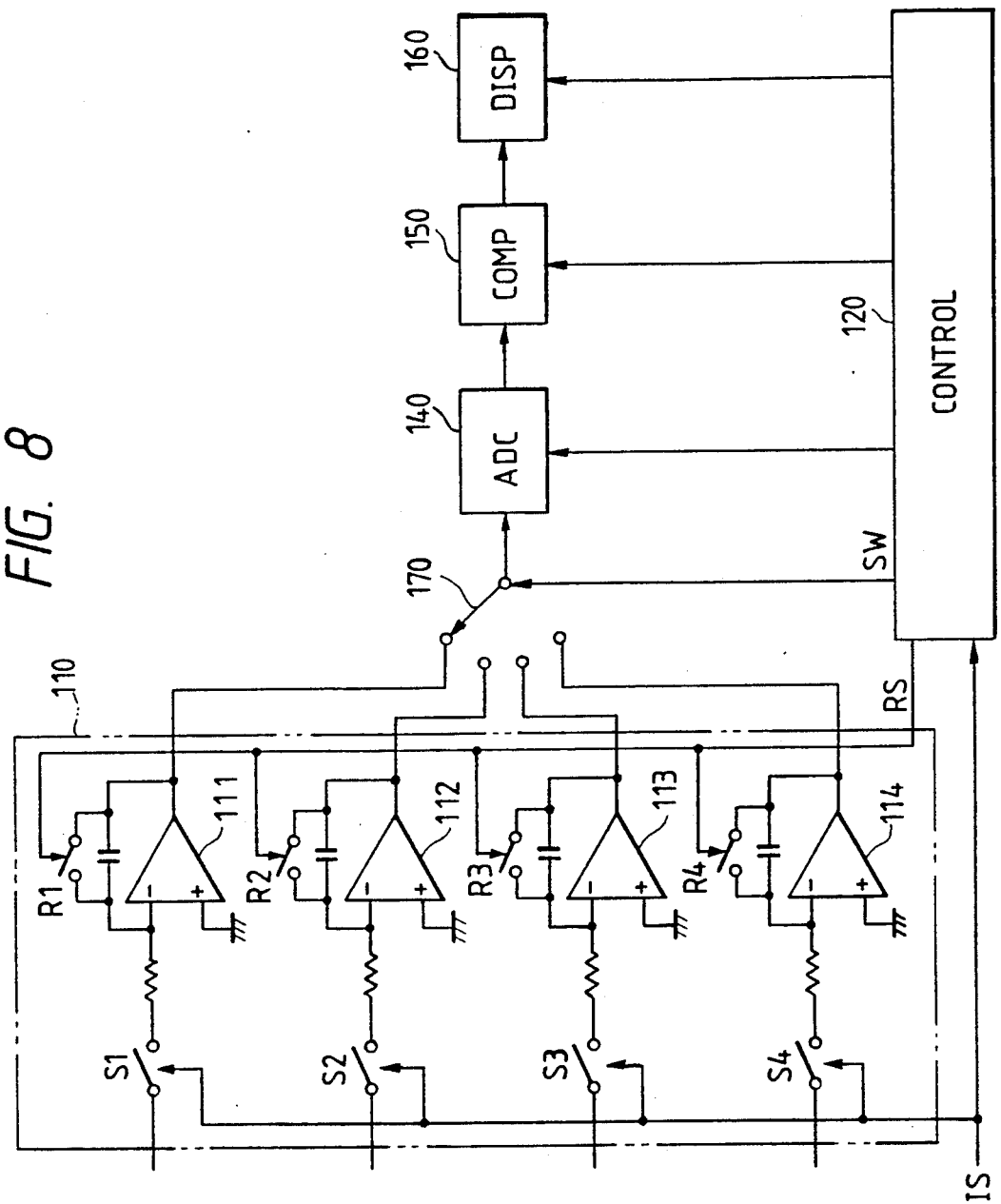

IMPEDANCE AND TRANSFER CHARACTERISTIC MEASURING APPARATUS

BACKGROUND OF THE INVENTION

The present invention relates to an apparatus for measuring the transfer characteristic of a servo system or filter, or the impedance of a capacitor or coil.

Conventionally, such a measuring apparatus as mentioned above has an arrangement in which a sine-wave test signal is applied to a measuring object to derive therefrom two signals related to an item of measurement thereof, the two related signals are multiplied by a sine-wave (or square-wave) signal in-phase with the test signal and a sine-wave (or square-wave) signal leading the test signal by a phase angle of 90° in analog form, respectively, the respective multiplied outputs are integrated for the period of an integer cycle from the time point of a zero phase of the test sine-wave signal after the generation of a measurement start signal, the two integrated outputs, i.e. two vector detected signals are A-D converted, and both output data are used to calculate the desired item of measurement.

FIG. 1 illustrates an example of such a conventional transfer characteristic measuring apparatus, in which a signal generating part 210 generates a sine-wave test signal TS, a sine-wave signal SI (or square-wave signal SQ) in-phase with the test signal TS, a sine-wave signal CO (or square-wave signal CQ) leading the test signal TS by a phase angle of 90°, and a synchronizing signal SS synchronized with the test signal TS, as shown in FIG. 2, and the test signal TS, is applied to a device under test 100. The sine-wave signal CO will also be referred to as cosine-wave signal. The sine-wave test signal TS, which is an input voltage of the device under test 100, is taken out as the one related signal A via a buffer 221, whereas the output voltage of the device under test 100 is taken out as the other related signal B via a buffer 223. The related signal A and the sine-wave signal SI (or square-wave signal SQ), the related signal A and the cosine-wave signal CO (or square-wave signal CQ), the related signal B and the sine-wave signal SI (or square-wave signal SQ), and the related signal B and the cosine-wave signal CO (or square-wave signal CQ) are multiplied in analog multipliers 231, 232, 233 and 234, respectively.

The synchronizing signal SS and a measurement start signal ST which is produced by a measurement starting operation are provided to a control part 240. The control part 240 applies an integration control signal IC to integration control switches S1 through S4 provided at the input terminals of integration circuits 251 through 254. As shown in FIG. 2, the integration control signal IC is made high for a period Pc of an integral multiple of a complete cycle of the test signal TS starting with zero after the generation of the measurement start signal ST. During the period Pc the integration control switches S1 through S4 are held ON, through which the output signals of the analog multipliers 231 through 234 are fed to the integration circuits 251 through 254 for integration.

Thereafter, a select switch 260 is switched from one fixed contact point to another under control of a switching signal SW from the control part 240 and the output signals of the integration circuits 251 through 254 are sequentially converted by an A-D converter (or "ADC") 270 to digital form accordingly. The output data of the A-D converter 270 are subject to calculation in a calculation part (or "COMP") 280 to obtain the results of measurement of the device under test (or "DUT") 100, which are displayed on a display part (or "DISP") 290. After the A-D conversion of the output signals of the integration circuits 251 through 254 in the A-D conversion part 270 reset switches R1 through R4 provided in the integration circuits 251 through 254 are momentarily turned ON by a reset signal RS from the control part 240, by which the integration circuits 251 through 254 are initialized.

Letting input and output voltages of the device under test 100 be represented by $$\dot{V}_{in} = R_{in} + jI_{in} \tag{1}$$

and $$\dot{V}_{ou} = R_{ou} + jI_{ou} \tag{2}$$

the transfer characteristic of the device under test 100 is expressed as follows:

$$\dot{G} = \frac{\dot{V}_{ou}}{\dot{V}_{in}} = \frac{R_{ou} + jI_{ou}}{R_{in} + jI_{in}} \tag{3}$$

where $R_{in}$ and $R_{ou}$ are real parts and $I_{in}$ and $I_{ou}$ are imaginary parts.

In the above conventional measuring apparatus the related signal A corresponding to the input voltage of the device under test 100 and the sine-wave signal SI (or square-wave signal SQ) are multiplied in analog form and the multiplied output is integrated for the period Pc, by which the real part $R_{in}$ in Eq. (3) is vector-detected. The related signal A and the cosine-wave signal CO (or square-wave signal CQ) are analog multiplied and the multiplied output is integrated for the period Pc, by which the imaginary part in Eq. (3) is vector-detected. The related signal B corresponding to the output voltage of the device under test 100 and the sine-wave signal SI (or square-wave signal SQ) are analog multiplied and the multiplied output is integrated for the period Pc, by which the real part $R_{ou}$ in Eq. (3) is vector-detected. The related signal B and the cosine-wave signal CO (or square-wave signal CQ) are analog multiplied and the multiplied output is integrated for the period Pc, by which the imaginary part in Eq. (3) is vector-detected. The transfer characteristic of the device under test 100 is obtained through calculation of Eq. (3) in the calculation part 280 with the use of the vector-detected outputs.

More specifically, in the case where the sine-wave signals SI and CO are employed, if the angular frequency of the sine-wave test signal TS is taken as $\omega$, the sine-wave signals SI and CO are represented by $\sin\omega t$ and $\cos\omega t$, respectively, and if the amplitude and the phase of the related signal A are taken as $a$ and $\phi$, respectively, the signal A is represented by $a \cdot \sin(\omega t + \phi)$. Assuming that the period Pc is an n cycle or cycles (where n = 1, 2, . . .) of the test signal TS starting from the time point of its zero phase, the vector-detected outputs are as follows:

$$Rin = \int_0^{2n\pi/\omega} a \cdot \sin(\omega t + \phi) \cdot \sin(\omega t)dt \qquad (4)$$
$$= -\frac{a}{2}\int_0^{2n\pi/\omega} \cos(2\omega t + \phi)dt + \frac{a}{2}\int_0^{2n\pi/\omega} \cos\phi\, dt$$
$$= \frac{na}{\omega}\cos\phi$$

$$Iin = \int_0^{2n\pi/\omega} a \cdot \sin(\omega t + \phi) \cdot \cos(\omega t)dt \qquad (5)$$
$$= \frac{a}{2}\int_0^{2n\pi/\omega} \sin(2\omega t + \phi)dt + \frac{a}{2}\int_0^{2n\pi/\omega} \sin\phi\, dt$$
$$= \frac{na}{\omega}\sin\phi$$

Letting the amplitude and the phase of the related signal B be represented by b and $\theta$, respectively, the signal B is expressed by $b\cdot\sin(\omega t+\theta)$. Hence, the vector-detected outputs are similarly given as follows:

$$Rou = \frac{nb}{\omega}\cos\theta \qquad (6)$$

$$Iou = \frac{nb}{\omega}\sin\theta \qquad (7)$$

In the case of measuring the impedance of the device under test 100, the difference between the input and output voltages of the device 100, that is, the voltage across the device 100, is extracted as the one related signal A and the current flowing through the device 100 is extracted as the other related signal B.

That is to say, letting the voltage across the device under test 100 and the current flowing therethrough be represented by $$\dot{V} = Rv + jIv \qquad (8)$$
$$\dot{I} = Ri + jIi \qquad (9)$$

the impedance of the device under test 100 is expressed as follows:

$$Z = \frac{\dot{V}}{\dot{I}} = \frac{Rv + jIv}{Ri + jIi} \qquad (10)$$

where Rv and Ri are real parts and Iv and Ii are imaginary parts. Accordingly, the related signal A corresponding to the voltage across the device under test 100 and the sine-wave signal SI (or square-wave signal SQ) are analog multiplied and the multiplied output is integrated for the period Pc, by which the real part Rv in Eq. (10) is vector-detected. The related signal A and the cosine-wave signal CO (or square-wave signal CQ) are analog multiplied and the multiplied output is integrated for the period Pc, by which the imaginary part IV is vector-detected. The related signal B corresponding to the current flowing through the device under test 100 and the sine-wave signal SI (or square-wave signal SQ) are analog multiplied and the multiplied output is integrated for the period Pc, by which the real part Ri in Eq. (10) is vector-detected. The related signal B and the cosine-wave signal CO (or square-wave signal CQ) are analog multiplied and the multiplied output is integrated for the period Pc, by which the imaginary part Ii is vector-detected. By performing the calculation of Eq. (10) in the calculation part 280 through use of these detected outputs, the impedance of the device under test 100 is obtained.

As described above, according to the conventional measuring apparatus, the analog-multiplied outputs of the two related signals A and B corresponding to the item of measurement of the device under test 100, the sine-wave signal SI (or square-wave signal SQ) in-phase with the sine-wave test signal TS and the sine-wave signal CO (or square-wave signal CQ) leading the test signal TS by a phase angle of 90° are respectively integrated for the period Pc of an integer cycle of the test signal TS from the time point of the zero phase of the test signal TS after the generation of the measurement start signal ST to perform the vector-detection of the related signals A and B. Hence, the prior art apparatus is defective in that measurement consumes much time especially when the frequency of the test signal TS is low and that the accuracy of measurement is not satisfactory owing to limited accuracy of the analog multipliers 231 through 234 in the case of using the sine-wave signals SI and CO as detecting signals.

The inventor of this application has proposed in his U.S. Pat. No. 4,947,130 (filed Dec. 14,1988) an impedance measuring apparatus which performs a synchronous detection by use of a multiplying type D/A converter with a view to improving the accuracy of measurement. In the impedance measuring apparatus, sine-wave test data read out of a waveform memory is D-A converted and is applied to a measuring object to derive therefrom a related signal corresponding to its output current, and at the same time, digital sine and cosine waves are read out of different waveform memories and are each multiplied in the multiplying type D/A converter by the related analog signal from the measuring object. With this arrangement, the accuracy of measurement can be increased. However, since the integration period of each multiplied output is determined by counting a predetermined number of times an overflow of an accumulator for generating an address which is used to read each waveform memory, that is, since the integration period is selected to be a period equal to an integral multiple of the cycle of the test sine wave and starting at the zero phase thereof, the measuring instrument disclosed in the above-mentioned United States patent also has the shortcoming that the measurement is time-consuming.

SUMMARY OF THE INVENTION

It is therefore an object of the present invention to provide a transfer characteristic or impedance measuring apparatus which, even if the frequency of the sine-wave test signal is low, permits measurement of a transfer characteristic or impedance at high speed and with a sufficiently high degree of accuracy.

The impedance or transfer characteristic measuring apparatus of the present invention includes: a clock generating part; a phase accumulating part for accumulating phase incremental data of a predetermined value for each pulse of the output clock of the clock generating part; a data generating part for generating sine-wave data and cosine-wave data based on the output data of the phase accumulating part; a D-A converting part for D-A converting the sine-wave data to obtain a sine-wave test signal and for applying the test signal to a measuring object; a test circuit part for obtaining two related signals concerning the item of measurement of the measuring object supplied with the sine-wave test signal; a multiplying type D-A converting part supplied with the related signals as analog multiply inputs, for D-A converting the sine-wave data and the cosine-wave data; a signal generating part for generating an integration control signal which reaches a predetermined level in a period of a half cycle of the sine-wave test signal; an integration circuit part for integrating a plurality of output signals of the multiplying type D-A converting part in the period in which the integration control signal reaches the predetermined level; an A-D converting part for concurrently or sequentially A-D converting the plurality of output signals of the integration circuit part; and a calculating part for calculating the output data of the A-D converting part to obtain a measured value on the item of measurement of the measuring object.

With such a measuring apparatus of the present invention, the sine-wave data and the cosine-wave data are respectively D-A converted by the multiplying type D-A converter using the related signal as analog multiplication inputs thereto, and the related signals are vector-detected by integrating the plurality of output signals of the multiplying type D-A converting part in the half-cycle period of the sine-wave test signal in which the integration control signal reaches the predetermined level. Hence, the item of measurement of the measuring object can be measured at high speed in a short time, even if the frequency of the sine-wave test signal is selected low.

BRIEF DESCRIPTION OF THE DRAWINGS

FIG. 8 is a block diagram showing still another example of that portion of the embodiment.

DESCRIPTION OF THE PREFERRED EMBODIMENTS

Figure 1:
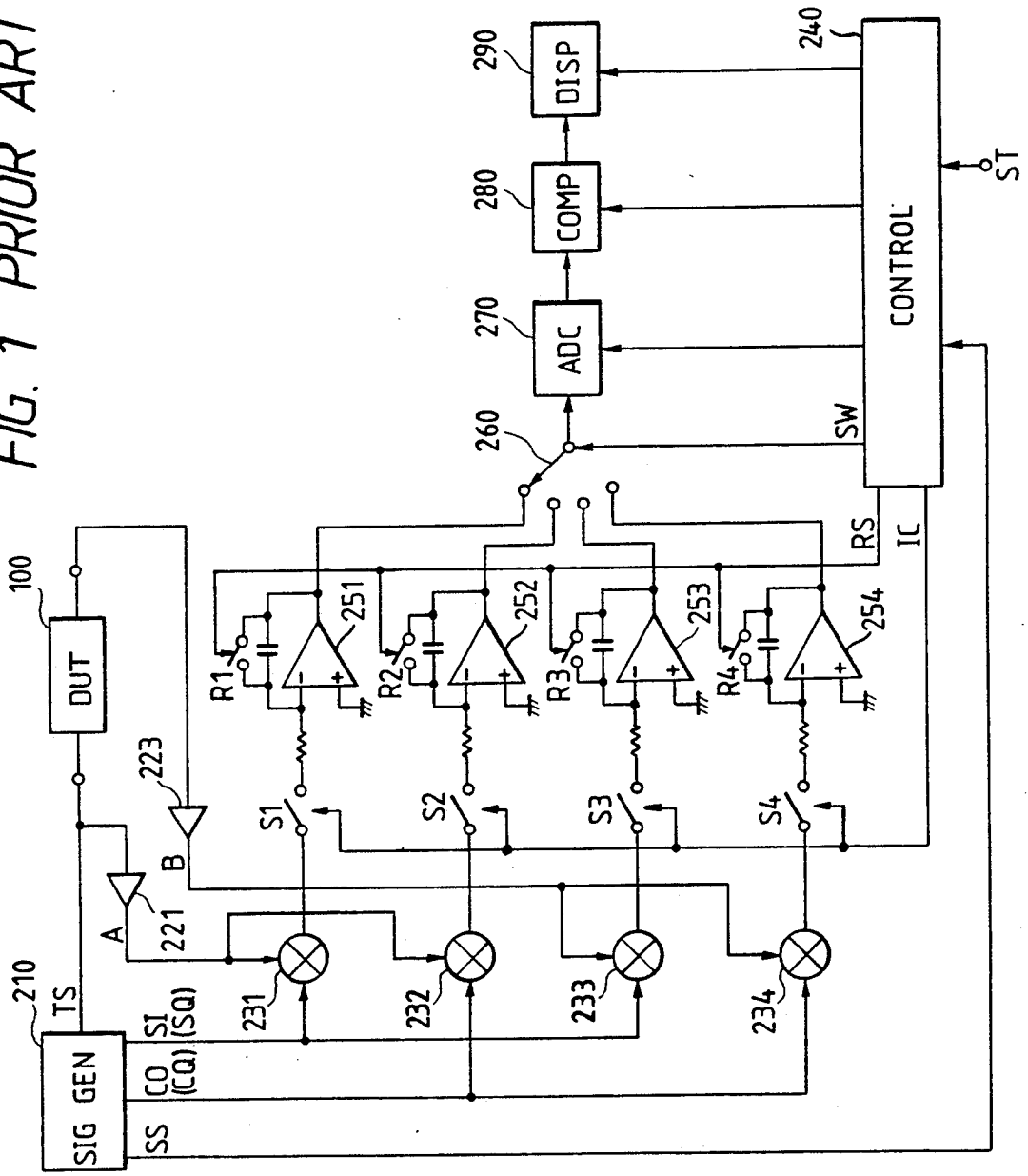
FIG. 1 is a system diagram showing an example of a conventional measuring apparatus.
Figure 2:
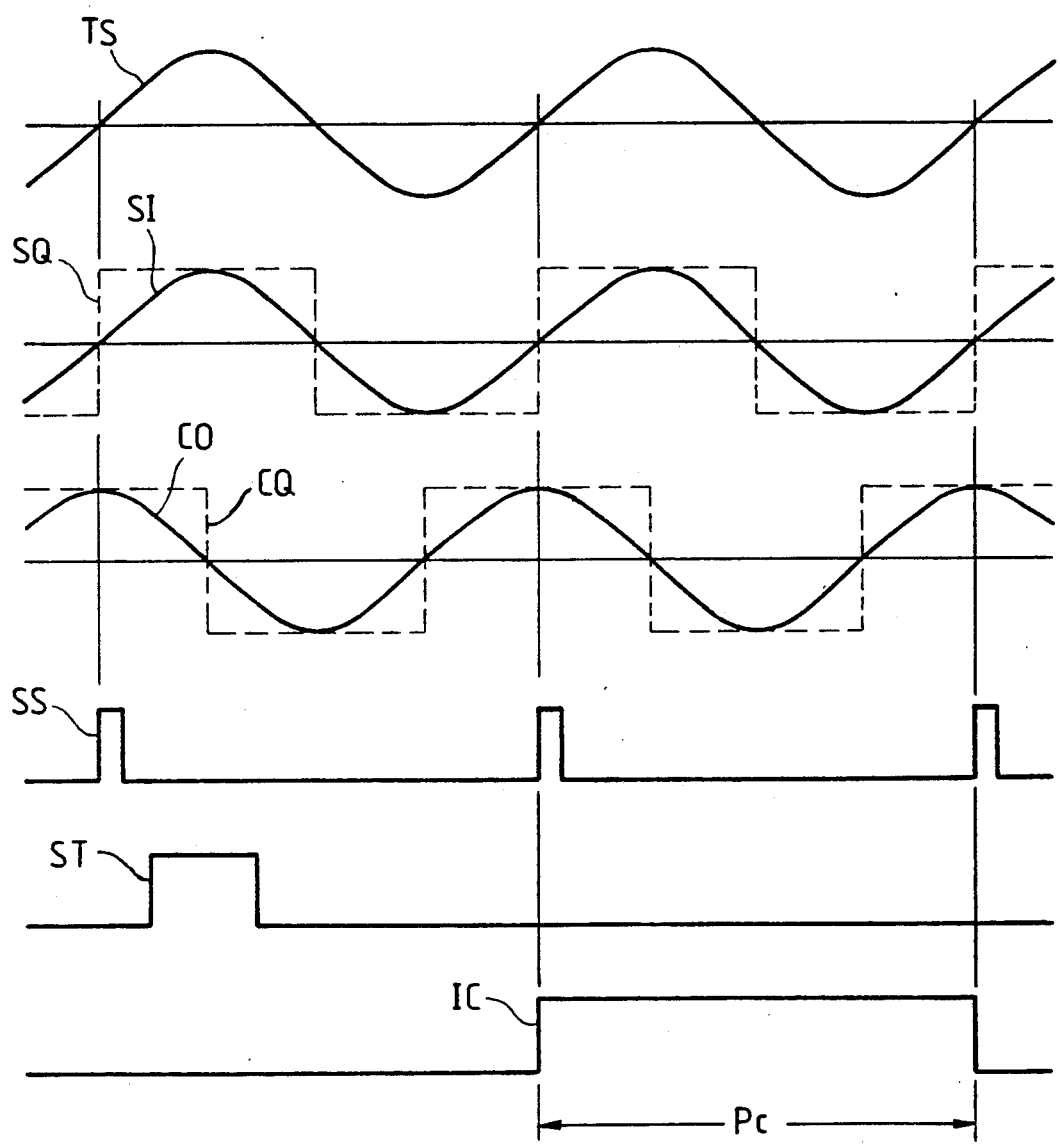
FIG. 2 is a timing chart for explaining the operation of the conventional measuring apparatus.
Figure 3:
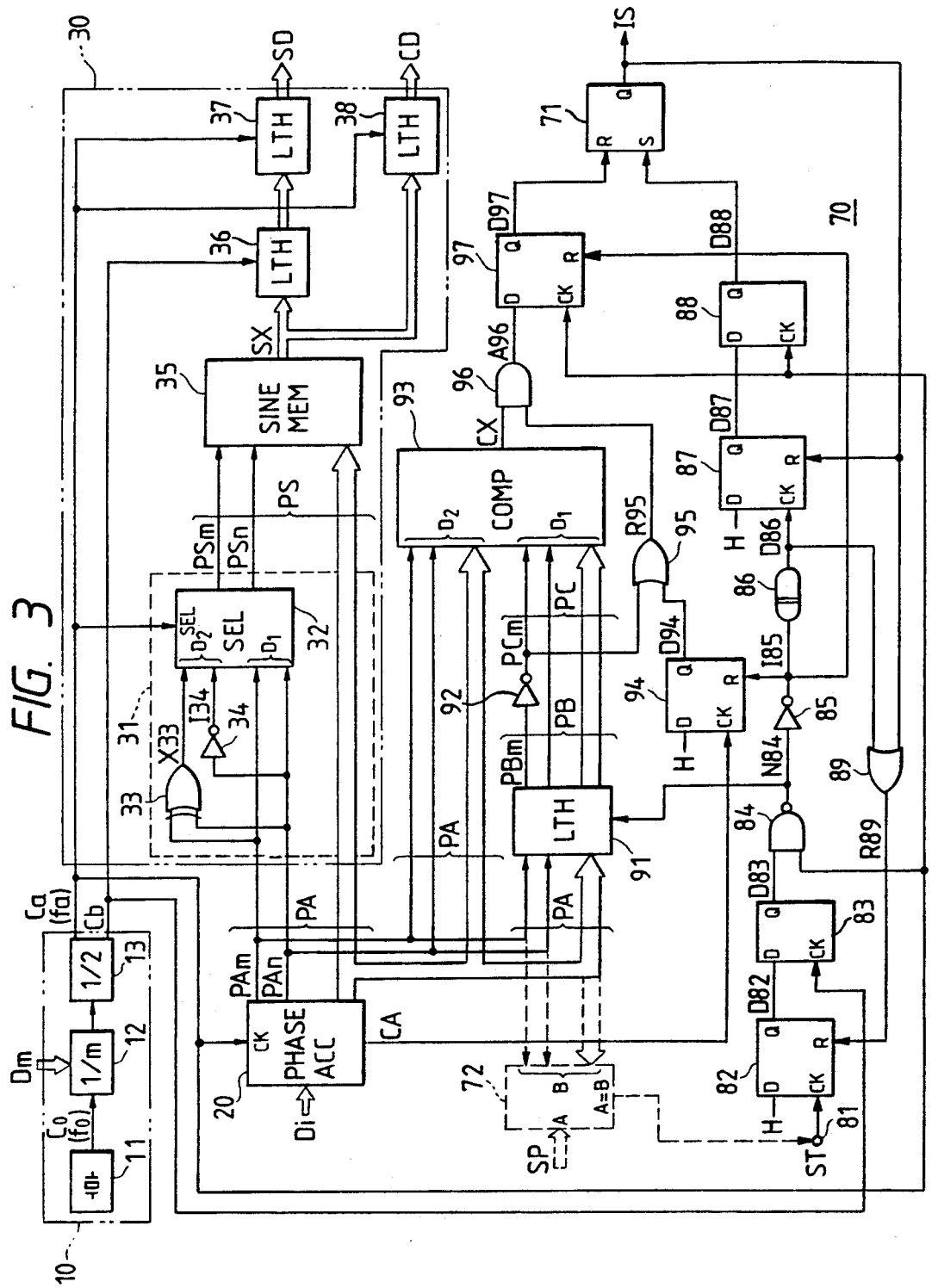
FIG. 3 is a block diagram illustrating a portion of an embodiment of the measuring apparatus of the present invention.
Figure 4:
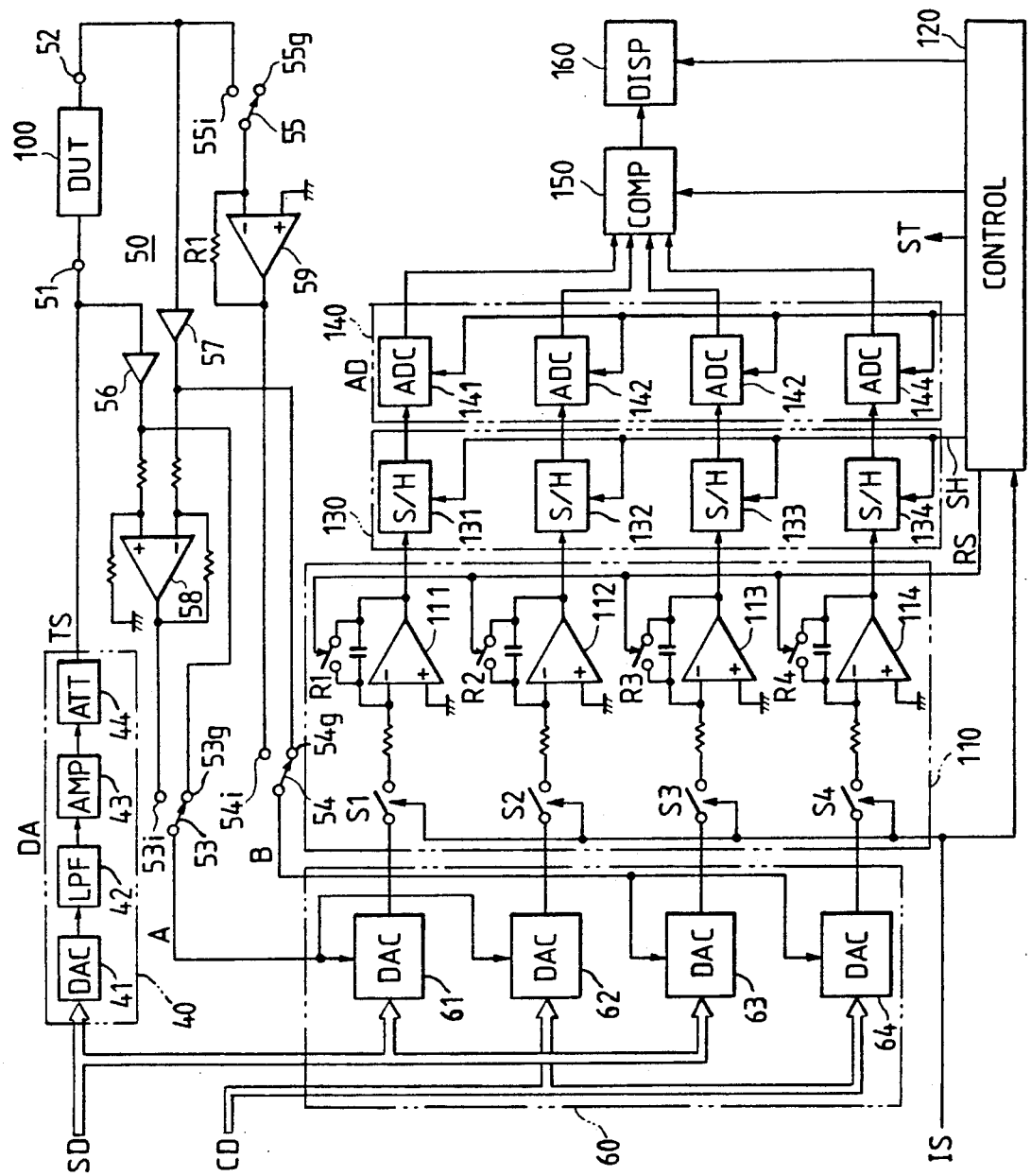
FIG. 4 is a block diagram illustrating the remaining portion of the embodiment depicted in FIG. 3.

FIGS. 3 and 4 illustrate in block form an embodiment of the measuring apparatus of the present invention, which is adapted so that the transfer characteristic or impedance measuring mode of operation can be selected by switching a select switch.

The measuring apparatus of this embodiment includes a clock generating part (or "PHASE ACC") 10, a phase accumulating part 20, a data gererating part 30, a D-A converting part 40, a test circuit part 50, a multiplying type D-A converting part 60, a signal generating part 70, an integration circuit part 110, a control part 120, a sample-hold part 130, an A-D converting part 140, a calculating part (or "COMP") 150, and a display part (or "DISP") 160.

The clock generating part 10 comprises a reference oscillator 11 for generating a reference clock Co of a frequency fo, a variable frequency divider 12 whose frequency dividing ratio m can be varied by frequency dividing ratio data Dm, and a ½ frequency divider 13. The reference clock Co is frequency divided by the variable frequency divider 12 down to 1/m, the resulting clock of a frequency fo/m is frequency divided by the ½ frequency divider 13, from which are provided, as the output clock of the clock generating part 10, clocks Ca and Cb of a frequency $fa = fo/2m$ but displaced 180° apart in phase. For example, $fo = 2.048$ MHz $= 2^{11}$ kHz. Accordingly, when $m = 1000$, then $fa = 1.024$ kHz $= 2^{10}$ Hz.

Figure 5:
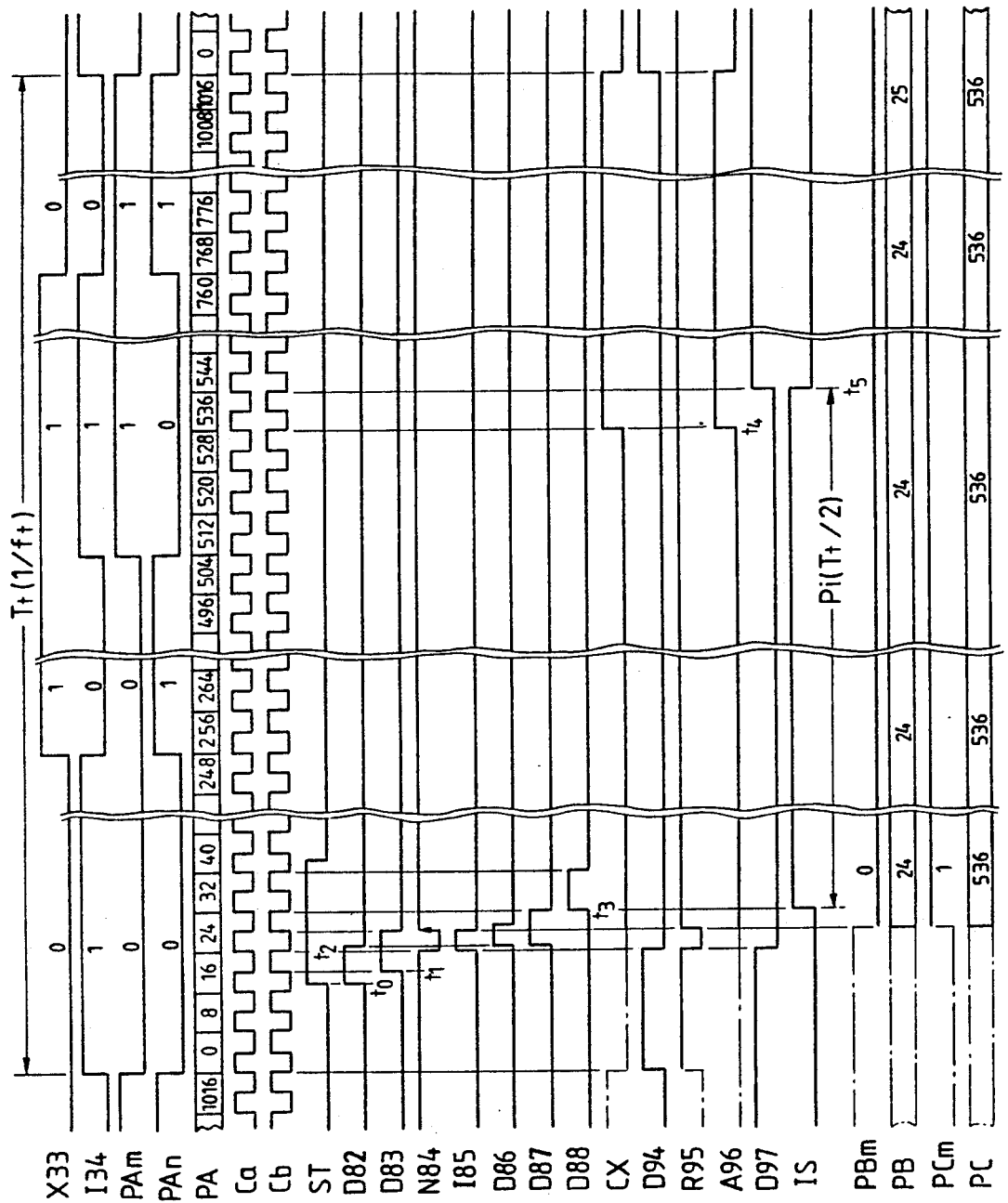
FIG. 5 is a timing chart for explaining the operation of the embodiment.
Figure 6:
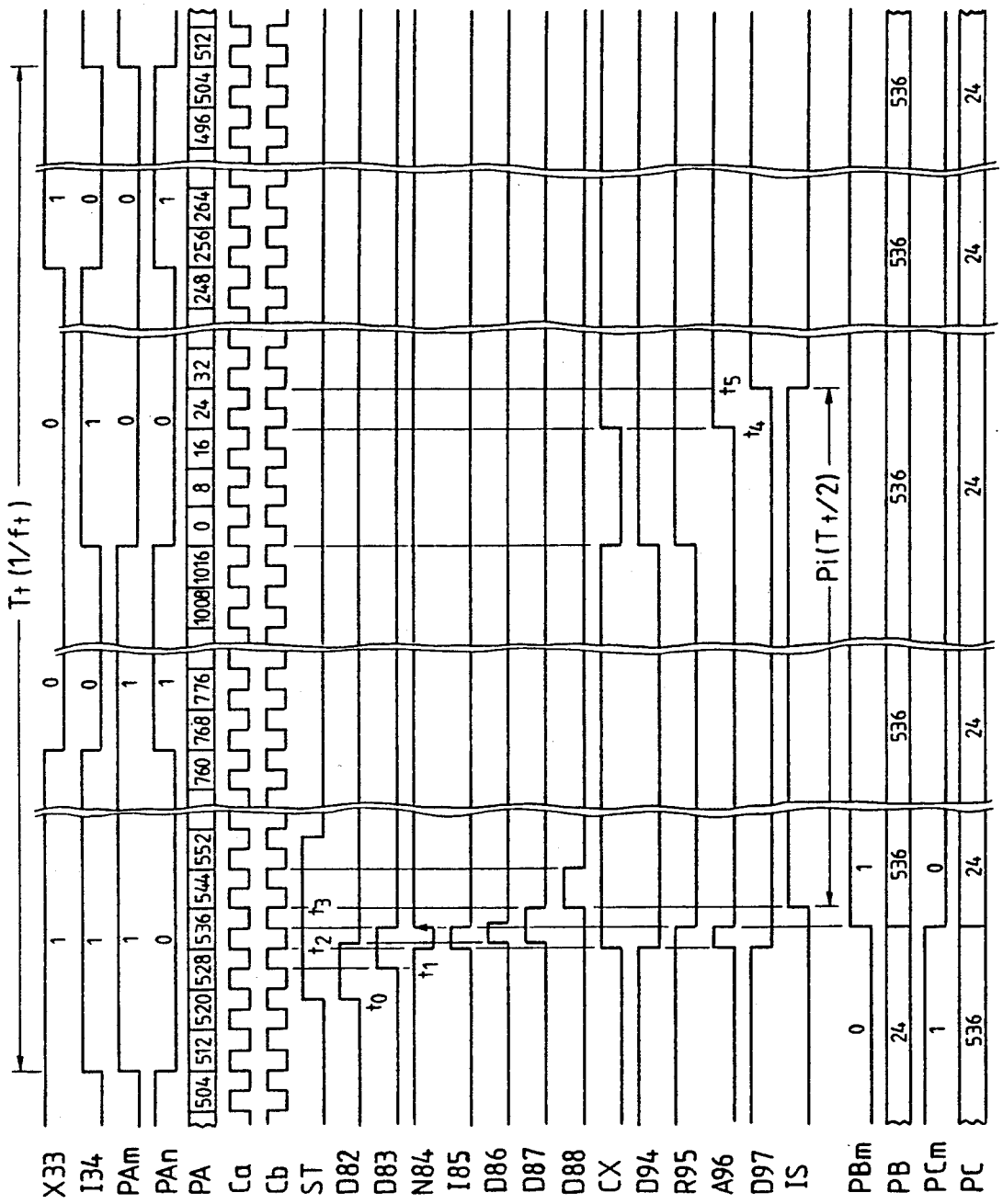
FIG. 6 is a timing chart for explaining another example of operation of the embodiment.

The phase accumulating part 20 is supplied at its clock terminal CK with the output clock Ca of the clock generating part 10 and, upon each application thereto of one pulse of the output clock Ca, accumulates phase incremental data Di corresponding to a predetermined value i. The phase accumulating part 20 has, for instance, a 10-bit structure. Accordingly, when $i = 8$, its output data PA varies in 128 ways from 0 to 1016 as shown in FIG. 5 or 6, and when $fa = 1.024$ kHz, the repetitive frequency of variation, ft, of the output data PA is 8 Hz. The phase accumulating part 20 is designed to provide a carry output CA when the output data PA becomes zero.

The data generating part 30 outputs sine-wave data SD and cosine-data CD based on the output data PA of the phase accumulating part 20. In this embodiment the data generating part 30 includes a phase shifter 31, a sine-wave memory (or "SINE MEM") 35 and latch circuits (or "LTD") 36 to 38.

The phase shifter 31 is composed of a data selector (or "SEL") 32, an exclusive-OR gate 33 and an inverter 34. The most significant bit PAm and the second-highest-order bit PAn of the output data PA of the phase accumulating part 20 are provided to the one data input terminal $D_1$ of the data selector 32 and the exclusive-OR gate 33. Further, the second-highest-order bit PAn is supplied to the inverter 34 and the output X33 of the exclusive-OR gate 33 and the output I34 of the inverter 34 are applied to the other data input terminal $D_2$ of the data selector 32.

The output clock Ca of the clock generating part 10 is applied to a select terminal SEL of the data selector 32. When the output clock Ca goes high, the data PAm and PAn fed to the data terminal $D_1$ of the data selector 32 are selected and are output as the most significant bit PSm and the second-highest-order bit PSn of the output data PS of the phase shifter 31. These bits and bits of the output data PA less significant than the second-highest-order bit PAn are handled as the output data PS of the phase shifter 31, that is, the output data PA of the phase accumulating part 20 is taken out intact as the output data PS of the phase shifter 31. When the output clock Ca goes low, the data X33 and I34 fed to the data terminal $D_2$ of the data selector 32 are selected and output as the most significant bit PSm and the second-highest-order bit PSn of the output data PS of the phase shifter 31. These bits and bits of the output data PA less significant than the second-highest-order bit PAn of the output data PA of the phase accumulating part 20 are used as the output data PS of the phase shifter 31.

The output X33 of the exclusive-OR gate 33 and the output I34 of the inverter 34 are a logic "0" and a logic "1", respectively, when the output data PA of the phase accumulating part 20 is within the range of between 0 and 255 and the most significant bit PAm and the second-highest-order bit PAn are both logic "0", as shown in FIGS. 5 and 6. When the output data PA is within the range of between 256 and 511 and the most significant bit PAm and the second-highest-order bit PAn are both logic "0", as shown in FIGS. 5 and 6. When the output data PA is within the range of between 256 and 511 and the most significant bit PAm and the second-highest-order bit PAn are logic "0" and logic "1", respectively, the output X33 is logic "1" and the output I34 is logic "0". When the output data PA is within the range of between 512 and 767 and the most significant bit PAm is logic "1" and the second-highest-order bit PAn is logic "0", the output X33 and the I34 are both logic "1". When the output data PA is within the range of between 768 and 1023 and the most significant bit PAm and the second-highest-order bit PAn are both logic "1", the outputs X33 and I34 are both logic "0". In practice, however, the output data PA of the phase accumulating part 20 varies only in 128 way from 0 to 1016 when i=8 as mentioned above.

Consequently, when the high-order two bits PAm and PAn of the output PA of the phase accumulating part 20 are "00", "01", "10" and "11", the outputs X33 and I34 of the exclusive-OR gate 33 and the inverter 34 are respectively "01", "10", "11" and "00", and these outputs are each always the sum of the values of the high-order two bits of the output data PA and "01". In other words, the output data PS of the phase shifter 31 becomes the output data PA of the phase accumulating part 20 itself when the output clock Ca goes high, whereas when the output clock Ca goes low the output data PS leads the output data PA by ¼ the cycle period Tf of its variation, that is, by 90°.

In the sine-wave memory 35 sine values corresponding to equally-spaced-apart, for example, 1024 angles ranging from 0° to 360° are prestored as digital data at addresses corresponding to the angles. The output data PS of the phase shifter 31 is provided as address data to the sine-wave memory 35, from which the digital data are read out one after another.

In consequence, the value of the output data PA of the phase accumulating part 20 is incremented by i=8 upon each application of the clock Ca as shown in FIG. 5, and in each cycle of the clock Ca sine-wave data corresponding to a sine-wave signal of a certain phase is read out of the sine-wave memory 35 as its output data SX when the output clock Ca is high-level, whereas when the clock Ca goes low, sine-wave data corresponding to a sine-wave signal which leads the above-mentioned sine-wave signal by a phase angle of 90° is read out of the memory 35.

The data SX read out of the sine-wave memory 35 in each cycle of the clock Ca when it was high-level is latched in the latch circuit 36 by the rise of the output clock Cb, and further, the output data of the latch circuit 36 is latched in the latch circuit 37 at the next rise of the output clock Ca, with the result that sine-wave data SD corresponding to the sine-wave signal of a certain phase is obtained from the latch circuit 37. On the other hand, the data SX read out of the sine-wave memory 35 in each cycle of the clock Ca when it was low-level is latched in the latch circuit by the next rise of the output clock Ca, and cosine-wave data CD which leads the sine-wave data SD from the latch circuit 37 by a phase angle of 90° is obtained from the latch circuit 38.

The D-A converting part 40 D-A converts the sine-wave data SD from the latch circuit 37 of the data generating part 30 to obtain the sine-wave test signal TS, which is applied to the device under test 100. More specifically, the sine-wave data SD is provided to a D-A converter 41 to obtain a sine-wave signal, which is applied to a low-pass filter 42, then amplified by an amplifier 43 and adjusted to a suitable level by an attenuator 44. In this way, the sine-wave test signal TS is created and applied to the device under test 100 connected to the test circuit part 50. The frequency of the sine-wave test signal TS is in agreement with the repetitive frequency ft of variation of the output data PA of the phase accumulating part 20. As mentioned previously, when m=1000 and i=8, the frequency of the test signal TS is 8 Hz.

The test circuit part 50 in this example has terminals 51 and 52, which are each connected to one end of the device under test or ("DUT") 100. The test circuit part 50 further includes change-over switches 53, 54 and 55, buffers 56 and 57, a differential amplifier 58 and a voltage-current converter 59. When connecting the change-over switches 53 through 55 to terminals 53g through 55g for measuring the transfer characteristic of the device under test 100, the sine-wave test signal TS which is an input voltage of the device 100 is taken out, as the one related signal A, from the change-over switch 53 via the buffer 56, and at the same time, the output voltage of the device 100 is taken out, as the other related signal B, from the change-over switch 54 via the buffer 57. When connecting the change-over switches 53 through 55 to terminals 53i through 55i for measuring the impedance of the device under test 100, the difference between the sine-wave test signal TS or the input voltage of the device 100 and the output voltage therefrom, both applied to the differential amplifier 58 via the buffers 56 and 57, respectively, that is, the voltage across the device 100 is taken out as the one related signal A. At the same time, the output current of the device under test 100 is applied to the current-voltage converter 59 and a voltage expressed by the product of the output current of the device 100 and a feedback resistance Rf of the current-voltage converter 59, that is, a voltage corresponding to the current flowing through the device 100 is provided, as the other related signal B, from the current-voltage converter 59 via the change-over switch 54.

The multiplying type D-A converting part 60 is made up of four multiplying type D-A converters (or "DAC"s) 61 through 64 in this example. In the multiplying type D-A converter 61 the sine-wave data SD fed thereto from the latch circuit 37 of the data generating part 30 is D-A converted using, as an analog multiplication input, the one related signal A available from the change-over switch 53 of the test circuit part 50. In the multiplying type D-A converter 62 the cosine-wave data CD fed thereto from the latch circuit 38 of the data generating part 30 is D-A converted using the related signal A as an analog multiplication input. In the multiplying type D-A converter 63 the sine-wave data SD is D-A converted using the other related signal B available from the change-over switch 54 of the test circuit part 50. In the multiplying type D-A converter 64 the cosine-wave data CD is D-C converted using the related signal B as an analog multiplication input.

Based on the measurement start signal ST available by measurement starting operation, the output clocks Ca and Cb of the clock generating part 10, the output data PA of the phase accumulating part 20 and the carry output CA, the signal generating part 70 generates, in this example, an integration control signal IS which goes high for the half-cycle period of the sine-wave test signal TS immediately following the rise of the measurement start signal ST. The signal generating part 70 is constituted by a RS flip-flop 71 for obtaining the integration control signal IS and its set and reset circuit systems.

In the set circuit system the measurement start signal ST, which is provided to a terminal 81, is supplied to a clock terminal CK of a D flip-flop 82. The D flip-flop 82 is also being supplied at its data terminal D with a high-level voltage H, and as shown in FIG. 5, its output D82 rises at the rise of the measurement start signal ST and is applied to a data terminal D of a D flip-flop 83. Incidentally, FIG. 5 is a timing chart in the case where the measurement start signal ST rises in the high-level period of the clock Ca. The output clock Cb of the clock generating part 10 is applied to a clock terminal CK of the D flip-flop 83, and as shown in FIG. 5, its output D83 rises at the rise of the output clock Cb (at time point $t_1$) immediately after the rise of the measurement start signal ST. The output D83 of the D flip-flop 83 and the output clock Ca of the clock generating part 10 are provided to a NAND gate 84, and as depicted in FIG. 5, its output N84 falls at the rise of the first output clock Ca (at time point $t_2$) occurring after the rise of the measurement start signal ST. The output N84 of the NAND gate 84 is applied to an inverter 85, in which it is inverted as shown in FIG. 5. The output I85 of the inverter 85 is applied to a delay circuit 86, in which it is delayed a little, and its output D86 is provided to a clock terminal CK of a D flip-flop 87. The D flip-flop 87 is being supplied at its data terminal D with the high-level voltage H, and as depicted in FIG. 5, its output D87 rises at a time point a little after the rise of the first output clock Ca occurring after the rise of the measurement start signal ST. The output D87 of the D flip-flop 87 is applied to a data terminal D of a D flip-flop 88, and as shown in FIG. 5, at the second rise of the output clock Ca applied to a clock terminal CK of the D flip-flop 88 (at time point $t_3$) after the rise of the measurement start signal ST, the output D87 is written into the D flip-flop 88 and its output D88 rises. The output D88 is applied to a set terminal S of the RS flip-flop 71, and as shown in FIG. 5, the integration control signal IS which is the output of the RS flip-flop 71 goes high at the second rise of the output clock Ca after the rise of the measurement start signal ST. In the case where the measurement start signal ST rises while the clock Ca is low-level, the integration control signal IS similarly rises at the third rise of the clock Ca (at time point $t_3$) after the rise of measurement start signal ST as shown in FIG. 6.

The output D86 of the delay circuit 86 and the integration control signal IS are applied to an OR gate 89, whose output R89 is applied to a reset terminal R of the D flip-flop 82, and at the rise of the output D86 of the delay circuit 86 or the integration control signal IS the D flip-flop 82 is reset. The integration control signal IS is also fed to a reset terminal R of the D flip-flop 87 to reset it at the rise of the integration control signal IS.

In the reset circuit system the output data PA of the phase accumulating part 20 at the time when the output N84 of the NAND gate 84 rises is latched by this output N84 in a latch circuit 91. The most significant bit PBm of the output data PB from the latch circuit 91 is provided to an inverter 92, and output data PC, which includes the output PCm of the inverter 92 as the most significant bit and bits less significant than the most significant one PBm of the output data PB from the latch circuit 91 as bits less significant than the most significant one PCm, is provided to the one data input terminal $D_1$ of a data comparator 93. That is, the output of the latch circuit 91 is caused by the inverter 91 to advance by a phase angle of 180° before being applied to the data input terminal $D_1$ of the data comparator 93. On the other hand, the output data PA of the phase accumulating part 20 is provided to the other data input terminal $D_2$ of the data comparator 93. The output CX of the data comparator 93 goes high when the output data PA is equal to or larger than the output data PC, whereas when the output data PA is smaller than the output data PC the output PX goes low.

FIG. 5 shows, as mentioned previously, the case where the measurement start signal ST goes high in the high-level period of the output clock Ca within the period during which the output data PA is "16". By the rise of the output N84 of the NAND gate 84 during the period in which the output data PA is "24", the data "24" is latched in the latch circuit 91. The output data PB of the latch circuit 91 goes to "24" after the rise of the output N84 of the NAND gate 84, and at the same time, the output PC goes to "536" after the rise of the output N84 of the NAND gate 84. Consequently, the output CX of the data comparator 93 remains low for the period during which the output data PA assumes values from "0" to "528", and the output CX remains high for the period during which the output data PA assumes values ranging from "536" to "1016". FIG. 6 shows the case where the measurement start signal ST goes high in the low-level period of the output clock Ca within the period during which the output data PA is "520". By the rise of the output N84 of the NAND gate 84 in the period during which the output data PA is "536", the data "536" is latched in the latch circuit 91. The output data PB becomes "536" after the output N84 of the NAND gate 84 goes high, and at the same time, the output data PC becomes "24" after the rise of the output N84 of the NAND gate 84. Consequently, the output CX of the data comparator 93 is low-level while the output data PA varies from "0" to "16" and high-level while the output data PA varies from "24" to "1016".

Furthermore, in the reset circuit system the carry output CA of the phase accumulating part 20 is applied to a clock terminal CK of a D flip-flop 94, which is supplied at its data terminal D with the high-level voltage H and at its reset terminal R with the output I85 of the afore-mentioned inverter 85. As shown in FIG. 5 or 6, at the time point when the output data PA of the phase accumulating part 20 becomes "0", the output D94 of the D flip-flop 94 goes high in response to the carry output CA, and upon first or second occurrence of the output clock Ca after the rise of the measurement start signal ST the D flip-flop 94 is reset by the output I85 of the inverter 85 and the output D94 goes low accordingly. The output D94 of the D flip-flop 94 and the output PCm of the afore-mentioned inverter 92 are applied to an OR gate 95. The output R95 of the OR gate 95 and the output CX of the data comparator 93 are fed to an AND gate 96, whose output A96 goes high at time point $t_4$ when the output data PA becomes equal to the output data PC, as shown in FIG. 5 or 6. The output A96 of the AND gate 96 is provided to a data terminal D of a D flip-flop 97 and is written therein by the output clock Ca fed to its clock terminal CK, and as depicted in FIG. 5 or 6, the output D97 of the D flip-flop 97 goes high at time point $t_5$ when the output data PA becomes greater than the output data PC. The output D97 of the D flip-flop 97 is applied to a reset terminal R of the RS flip-flop 71, and as shown in FIG. 5 or 6, at time point t5 when the output data PA becomes larger than the output data PC the RS flip-flop 71 is reset and the integration control signal IS which is the output thereof goes low.

Consequently, as will be seen from FIG. 5 or 6, the integration control signal IS is high-level for a period of time ½ the cycle period Tt of the output data PA of the phase accumulating part 20, starting at the occurrence of the clock Ca immediately after or its second occurrence after the generation of the measurement start signal ST, that is, for the half-cycle period Pi of the sine-wave test signal TS which is applied from the D-A converting part 40 to the device under test 100.

Incidentally, the output I85 of the inverter 85 is applied to a reset terminal R of the D flip-flop 97 to reset it at the rise of the output I85 of the inverter 85.

The integration circuit part 110 comprises, in this example, four integration circuits 111 through 114 each corresponding to one of the four multiplying type D-A converters 61 through 64 forming the multiplying type D-A converting part 60. Integration control switches S1 through S4 are connected to the integration circuits 111 through 114 at their input side and the integration control signal IS from the RS flip-flop 71 of the signal generating part 70 is applied to control these switches S1 through S4. For the afore-mentioned half-cycle period Pi of the sine-wave test signal TS during which the integration control signal IS remains high-level the integration control switches S1 through S4 are held ON, through which the output signals of the multiplying type D-A converters 61 through 64 are fed to and integrated in the integration circuits 111 through 114.

The integration control signal IS is also supplied to the control part 120, and immediately after the period Pi output signals of the integration circuits 111 through 114 are sample-held, by a control signal SH from the control part 120, in sample hold circuits 131 through 134 forming the sample hold part 130. Then, output signals of the sample hold circuits 131 through 134 are simultaneously A-D converted by A-D converters 141 through 144 forming the A-D converting part 140. Output data of the A-D converters 141 through 144 are calculated in the calculation part 150 to obtain the measured value of the transfer characteristic or impedance of the device under test 100, which is displayed on the display part 160.

The integration circuits 111 through 114 have reset switches R1 to R4, respectively. Immediately after the output signals of the integration circuits 111 to 114 are sample-held in the sample hold circuits 131 to 134 the reset switches R1 to R4 are momentarily turned ON to discharge integration capacitors, by which the integration circuits 111 to 114 are initialized for the next integration.

In general, the input voltage and the output voltage of the device under test 100 are expressed by Eqs. (1) and (2), the voltage across the device 100 and the current flowing therethrough are expressed by Eqs. (8) and (9), and the transfer characteristic and the impedance of the device 100 are expressed by Eqs. (3) and (10), as referred to previously. In the measuring apparatus according to the above-described embodiment of the present invention, letting the angular frequency of the sine-wave test signal TS be represented by $\omega$, the sine-wave signal and the cosine-wave signal which are obtained by D-A converting the sine-wave data SD and the cosine-wave data CD available from the data generating part 30 are expressed by $\sin \omega t$ and $\cos \omega t$, respectively. Letting the amplitude and the phase of the related signal A corresponding to the input voltage of the device under test 100 or the voltage across it be represented by a and $\phi$, respectively, the related signal A is expressed by $a \cdot \sin(\omega t + \phi)$. Hence, assuming that the period Pi is the half cycle of the sine-wave test signal TS starting at the time point of a certain phase angle $\alpha$ of the signal TS, the output signals Ra and Ia of the integration circuits 111 and 112 after the integration therein of the output signals of the multiplying type D-A converters 61 and 62 for the period Pi are as follows:

$$Ra = \int_{\alpha/\omega}^{(\alpha + \pi)/\omega} a \cdot \sin(\omega t + \phi) \cdot \sin(\omega t) dt$$
$$= \frac{a}{2} \int_{\alpha/\omega}^{(\alpha + \pi)/\omega} \cos(\omega t + \phi) dt +$$
$$\frac{a}{2} \int_{\alpha/\omega}^{(\alpha + \pi)/\omega} \cos\phi \, dt$$
$$= \frac{a}{2\omega} \cos\phi \tag{11}$$

$$Ia = \int_{\alpha/\omega}^{(\alpha + \pi)/\omega} a \cdot \sin(\omega t + \phi) \cdot \cos(\omega t) dt$$
$$= \frac{a}{2} \int_{\alpha/\omega}^{(\alpha + \pi)/\omega} \sin(2\omega t + \phi) dt +$$
$$\frac{a}{2} \int_{\alpha/\omega}^{(\alpha + \pi)/\omega} \sin\phi \, dt$$
$$= \frac{a}{2\omega} \sin\phi \tag{12}$$

Letting the amplitude and the phase of the related signal B corresponding to the output voltage of the device 100 or the current therethrough be represented by b and $\theta$, respectively, the related signal B is expressed by $b \cdot \sin(\omega t + \theta)$. Hence, the output signals Rb and Ib of the integration circuits 113 and 114 after the integration therein of the multiplying type D-A converters 63 and 64 for the period Pi are similarly as follows:

$$Rd = \frac{b}{2\omega} \cos\theta \tag{13}$$

$$Id = \frac{b}{2\omega} \sin\theta \tag{14}$$

Since the output signals Ra, Ia, Rb, and Ib become only ½ of the vector-detected outputs Rin, Iin, Rou and Iou given by Eqs. (4), (5), (6), and (7), the output signals Ra, Ia, Rb and Ib correspond to the vector-detected outputs Rin, Iin, Rou and Iou in Eq. (3) which expresses the transfer characteristic of the device under test 100, or the vector-detected outputs Rv, Iv, Ri and Ii in Eq. (10) which expresses the impedance of the device 100. Thus it has been proved that even if the integration period is an arbitrary half-cycle period of the sine-wave signal, the transfer characteristic or impedance of the device under test 100 can be obtained through calculation of Eq. (3) or (10) by substituting the output signals Ra, Ia, Rb and Ib for Rin, Iin, Rou and Iou in Eq. (3) or for Rv, Iv, Ri and Ii in Eq. (10) in the calculation part 150.

Since the related signals A and B are vector-detected by such integration of the output signals of the multiplying type D-A converters 61 through 64 in an arbitrary half-cycle period Pi of the sine-wave test signal TS, the transfer characteristic or impedance of the device under test 100 can be measured rapidly in a short time, even if the frequency ft of the test signal TS is low, for example, 8 Hz as mentioned previously.

The present invention ensures highly accurate measurement, because the multiplying type D-A converters 61 through 64 D-A convert the sine-wave data SD and the cosine-wave data CD through use of the related signals A and B as analog multiplication inputs instead of analog multiplication of the related signals A and B and the sine-wave signal and the cosine-wave signal used as detecting signals.

In the embodiment described above, immediately after the period Pi the output signals of the integration circuits 111 through 114 are simultaneously sample-held in the sample hold circuits 131 through 134, directly after which the reset switches R1 through R4 of the integration circuits 111 through 114 are momentarily turned ON to make the circuits 111 to 114 ready for the next integration, and at the same time, the output signals of the sample hold circuits 131 through 134 are simultaneously A-D converted by the A-D converters 141 through 144. Hence, high-speed measurement can be achieved.

Figure 7:
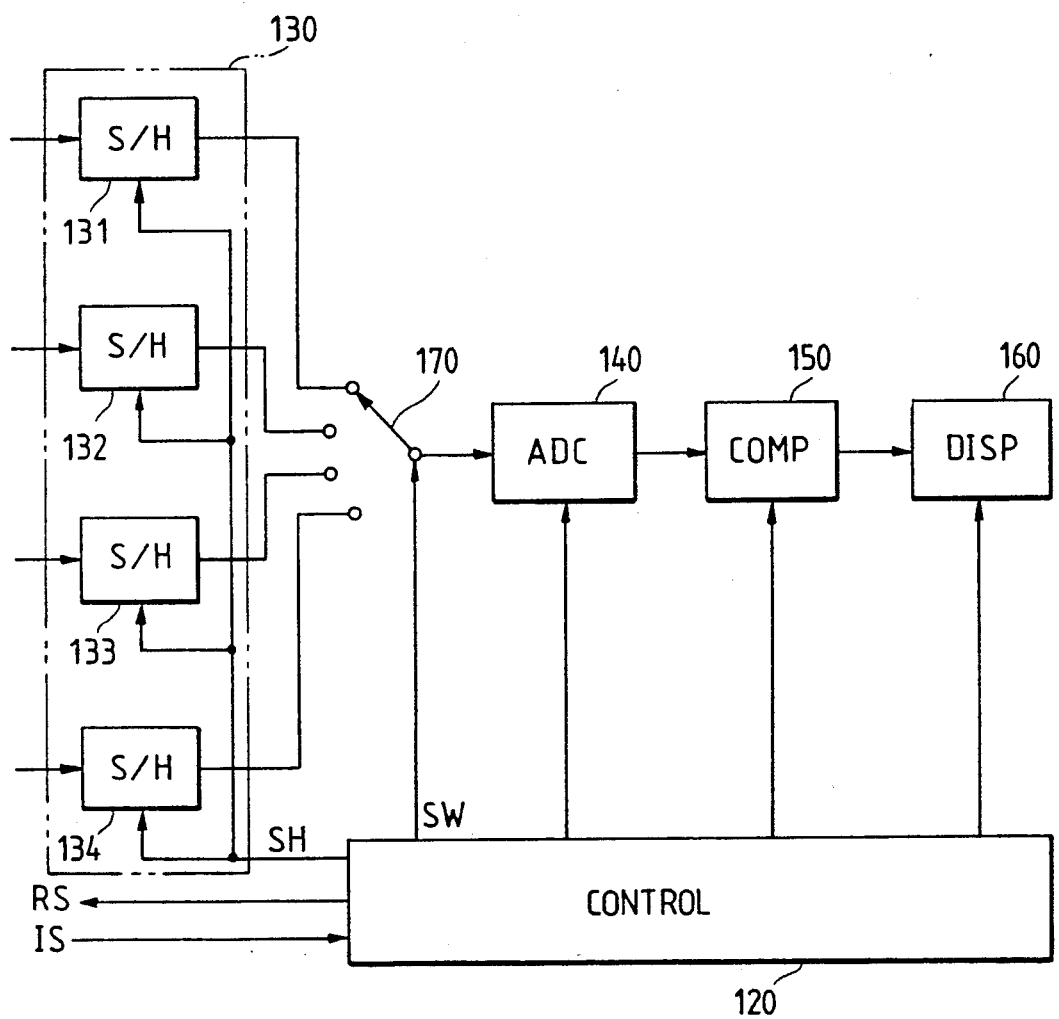
FIG. 7 is a block diagram illustrating another example of one portion of the measuring apparatus of the present invention.

FIG. 7 shows a modified form of the above-described embodiment, in which the A-D converting part 140 is formed by a single A-D converter, a select switch 170 is interposed between the A-D converting part 140 and the sample hold circuits 131 to 134 and the select switch 170 is changed over to the sample hold circuits one after another by a switching signal SW from the control part 120 so that the output signals of the sample hold circuits 131 through 134 are sequentially A-D converted in the A-D converting part 140.

FIG. 8 shows another modification of the above embodiment, in which no sample hold part is provided, the A-D converting part 140 is formed by a single A-D converter and the select switch 170 is provided between the A-D converting part 140 and the integration circuits 111 through 114. Immediately after the period Pi the select switch 170 is changed over to the integration circuits 111 through 114 in a sequential order to A-D convert their output signals one after another in the A-D converting part 140, after which the reset switches R1 through R4 of the integration circuits 111 to 114 are turned ON momentarily.

According to the embodiments described above, in the half-cycle period Pi of the sine-wave test signal TS directly after the generation of the measurement start signal ST the integration control signal IS goes high in synchronism with the clock signal Ca to turn ON the integration control switches S1 through S4, through which the output signals of the multiplying type D-A converters 61 to 64 are applied to and integrated by the integration circuits 111 to 114—this permits higher-speed measurement. It is also possible to utilize such an arrangement as indicated by the broken lines in FIG. 3. In this instance, data SP of a predetermined value for timing the start of integration is provided to the signal generating part 70, in which the data SP and the output data PA of the phase accumulating part 20 are compared in a data comparator 72 of the same construction as the aforementioned data comparator 93 and the measurement start signal ST is produced when coincidence is detected between the both data. With such an arrangement, the phase of the sine-wave test signal TS in the period of integration of the output signals from the multiplying type D-A converters 61 through 64 can be preset so that the integration control signal IS goes high when the phase of the sine-wave test signal TS reaches a desired value and goes low after the elapse of time corresponding to the half cycle of the test signal TS. Consequently, it is possible to observe, for example, whether or not the transfer characteristic or impedance of the device under test 100 changes with different amplitudes of the sine-wave test signal TS for its positive and negative half cycles. Alternatively, the control part 120 may be constructed so that it generates the measurement start signal ST a certain short time after the end of each sample hold signal SH. With such an arrangement, fluctuations of the related voltages A and B for every fixed period of time can be measured repeatedly. Also it is possible to employ an arrangement in which the control part 120 generates the measurement start signal a certain elapsed time after receiving a start signal from the outside.

Moreover, the data generating part 30 may be of an arrangement in which a cosine-wave memory is provided in place of the phase shifter 31 as proposed in the afore-mentioned United States patent and the output data PA of the phase accumulating part 20 is provided intact as address data to each of the sine-wave memory 35 and the above-said cosine-wave memory to read out therefrom the afore-mentioned sine-wave data SD and cosine-wave data CS, respectively.

The present invention is not limited specifically to the measurement of transfer characteristic and impedance but is applicable as well to the measurement of admittance, capacitance, inductance, etc. According to the item of measurement, the multiplying type D-A converting part 60 and the integration circuit part 110 may be arranged so that they include two multiplying type D-A converters and two integration circuits, respectively. In this instance, it is also possible to adopt an arrangement in which the sine-wave data SD or cosine-wave data CD is D-A converted by the one multiplying type D-A converter using the one related signal as an analog multiply input, the output signal of the one multiplying type D-A converter is integrated by the one integration circuit, the cosine-wave data CD or sine-wave data SD is D-A converted by the other multiplying type D-A converter using the other related signal as an analog multiplication input and the output signal of the other multiplying type D-A converter is integrated by the other integration circuit.

As described above, according to the present invention, the transfer characteristic or impedance of the device under test can be measured at high speed and with a high degree of accuracy, even if the frequency of the sine-wave test signal is low.

It will be apparent that many modifications and variations may be effected without departing from the scope of the novel concepts of the present invention.

What is claimed is:

1. An impedance and transfer characteristic measuring apparatus comprising:

clock generating means for generating a clock signal of a fixed frequency:

phase accumulating means for accumulating phase incremental data of a preset value for each pulse of the output clock signal of said clock generating means, and for generating output data based on the phase incremental data;

waveform data generating means for generating sine-wave data and cosine-wave data based on output data of said phase accumulating means;

D-A converting means for D-A converting said sine-wave data to obtain a sine-wave test signal and for applying said sine-wave test signal to a device under test;

test circuit means whereby two related signals corresponding to an item of measurement of said device under test are obtained in response to the application thereto of said sine-wave test signal;

multiplying type D-A converting means whereby said sine-wave data and said cosine-wave data are each D-A converted using one of said related signals as analog multiply input, respectively;

control signal generating means for generating an integration control signal which reaches a predetermined level in a desired half-cycle period of said sine-wave test signal;

integration circuit means for integrating a plurality of output signals from said multiplying type D-A converting means for the period of time during which said integration control signal is high-level;

A-D converting means for A-D converting a plurality of output signals from said integration circuit means simultaneously or sequentially; and calculating means for calculating the output data of said A-D converting means to obtain a measured value of said item of measurement of said device under test.

2. The measuring apparatus of claim 1, wherein said control signal generating means includes:

synchronization setting means responsive to a measurement start signal for setting said integration control signal to said predetermined level in synchronism with said clock signal;

latch means responsive to said measurement start signal for latching said output data of said phase accumulating means;

phase shifting means for advancing the phase of said latched output data by a phase angle of 180°; and data compare means for comparing said output data of said phase accumulating means and the output data of said phase shifting means to detect coincidence therebetween and for resetting said synchronization setting means by its coincidence detection output to terminate said integration control signal.

3. The measuring apparatus of claim 2, wherein said phase shifting means includes inverter means for inverting the most significant bit of the output data of said latch means and for outputting data with the most significant bit of the input data thereto inverted.

4. The measuring apparatus of claim 1, wherein said data generating means includes:

phase shifting means for advancing the phase represented by said output data from said phase accumulating means by a phase angle of 90° in synchronism with said clock signal;

a sine-wave memory accessible with phase data from said phase shifting means for reading out therefrom sine-waveform data stored therein; and latch means for latching both waveform data read out from said sine-wave memory when said phase data is advanced by a phase angle of 90° and waveform data read out from said sine-wave memory when said phase data is returned to its initial phase and for outputting said phase data as said cosine-wave data and sine-wave data, respectively.

5. The measuring apparatus of claim 4, wherein said phase shifting means includes:

exclusive-OR means for outputting the exclusive-OR of the most significant two bits of said output data of said phase accumulating means;

inverting means for inverting the bit second from the most significant bit of said output data as an inverted output; and data selector means for alternately selecting from among said exclusive-OR output, one bit of said inverted output and the most significant two bits of said output data in synchronism with said clock signal, and outputting the selected bits together with said output data of said phase accumulating means excluding the high-order two bits thereof.

6. The measuring apparatus of claim 1, further comprising phase comparing means for comparing the output data of said phase accumulating means and desired phase data and, when coincidence is detected, for generating a measurement start signal.

7. The measuring apparatus of claim 1, wherein said test circuit means includes:

difference voltage signal output means for outputting a voltage signal of the difference between said sine-wave test signal to be applied to said device under test and an output signal therefrom, and first switching means for selecting and outputting, as one of said two related signals, either one of said difference voltage signal and said sine-wave test signal.

8. The measuring apparatus of claim 7, wherein said test circuit means includes:

current-voltage converting means for converting an output current signal from said device under test into the corresponding voltage signal, and second switching means for selecting and outputting, as the other of said two related signals, either one of said voltage signal from said current-voltage converting means and an output voltage from said device under test.

* * * * *